United States Patent [19]

Lee

[11] Patent Number: 5,686,842
[45] Date of Patent: Nov. 11, 1997

[54] KNOWN GOOD DIE TEST APPARATUS AND METHOD

[76] Inventor: Shaw Wei Lee, 10410 Miller Ave., Cupertino, Calif. 95014

[21] Appl. No.: 521,619

[22] Filed: Aug. 31, 1995

[51] Int. Cl.$^6$ .................................................. G01R 1/073
[52] U.S. Cl. .............................. 324/755; 324/757
[58] Field of Search .................................. 324/755, 754, 324/757; 439/91

[56] References Cited

U.S. PATENT DOCUMENTS

| | | | |
|---|---|---|---|
| 4,783,719 | 11/1988 | Jamison et al. | 324/537 |
| 4,922,376 | 5/1990 | Pommer et al. | 324/755 |
| 4,955,523 | 9/1990 | Calomagno et al. | 228/179 |
| 5,367,253 | 11/1994 | Wood et al. | 324/754 |

Primary Examiner—Ernest F. Karlsen
Attorney, Agent, or Firm—Skjerven, Morrill, MacPherson, Franklin & Friel, LLP; Patrick T. Bever

[57] ABSTRACT

An apparatus and method for testing an integrated circuit chip prior to mounting on a package including a non-conductive tape upon which are formed a plurality of contacts arranged in a pattern matching the arrangement of bonding pads of an integrated circuit, and a z-axis conductor placed over the conductive tape. The target chip is placed on the z-axis conductor and test signals are transmitted between the contacts on the tape and the bonding pads of the integrated circuit through conductors embedded in the z-axis conductor. In one embodiment, a glass or ceramic plate including openings, arranged in the same pattern as the bonding pads, is placed between the integrated circuit and the z-axis conductor to prevent damage to the integrated circuit.

13 Claims, 2 Drawing Sheets

KNOWN GOOD DIE TEST APPARATUS AND METHOD

BACKGROUND OF THE INVENTION

1. Field of the Invention

This invention relates to apparatus and methods for testing integrated circuit chips (dies) before assembly.

2. Related Art

In current integrated circuit technology, there are three primary chip-to-package interconnection methods used for routing electrical signals between an integrated circuit chip and a package. These three methods of chip-level interconnection are wirebonding, tape automated bonding (TAB), and controlled collapse chip connection (also known as "C4" or "flip chip" interconnection).

Advances in integrated circuit technologies have increased the number of chip-to-package connections per integrated circuit chip. It is recognized that wirebonding and TAB provide a relatively small number of interconnections in comparison with C4. This limitation leaves C4 as the most promising technology for providing the ever-increasing number of chip-to-package connections per integrated circuit chip.

C4 interconnection requires the formation of a solder bump array on the bond pads on an integrated circuit chip (typically referred to as a flip chip) using metal mask technology. A corresponding bond pad array is also formed on a package substrate. The solder bumps and substrate bond pads are contacted, then heated to reflow the solder. The solder is then cooled to form a bond between the flip chip and substrate.

Known good die (KGD) refers to testing of integrated circuit chips prior to packaging. KGD is particularly important when several integrated circuit chips are mounted onto a multichip module (MCM) package. The use of KGD has also increased in single chip applications over the last few years. After KGD, tested dies generally can be assembled through a standard assembly process, including C4 interconnection.

A problem with KGD testing prior to packaging is that the cost of KGD testing is much higher in many single chip package applications than the cost of post-packaging testing (often two or three times).

One KGD testing method used to test flip chips requires placing a flip chip into a special carrier which provides necessary connections with the substrate bond pads. However, this prior art testing method is very expensive.

What is needed is a low cost KGD testing apparatus and method.

SUMMARY OF THE INVENTION

In accordance with the present invention, testing apparatus and methods are disclosed which provide low cost known good die (KGD) testing of flip chips prior to mounting on direct chip attach (DCA) packages.

In accordance with a first embodiment of the present invention, a KGD testing apparatus includes a polyamide tape supported by a non-conductive stiffener plate. The tape is designed to fit the existing test sockets (for example, PQFP or PLCC test sockets), and includes a pattern of upper contacts which are arranged to match the array of bonding pads of a target flip chip. A z-axis conductor is placed over the tape and a ceramic or glass plate is placed over the z-axis conductor. The ceramic or glass plate is drilled or etched to have the exact die pad layout of the target flip chip. The target flip chip is then placed over the ceramic or glass plate such that the bonding pads of the flip chip align with the openings in the plate. The target flip chip is then pressed against the plate such that the z-axis conductor provides electrical connection between the bond pads of the target flip chip and the upper contacts of the tape. The die is pressed by a non-conductive cold plate (for example, anodized Al) which applies the contact force required to either break the Al oxide on the pads or to provide sufficient force to make proper contact if the die pad is gold plated.

In one embodiment, the z-axis conductor includes a plurality of mini-springs which act as contact pins. The mini-springs are supported by an elastic underfill material and aligned in a z-axis direction. Assuming the mini-springs have a linear spring constant, the contact force for pressing the cold plate against a tested die may be calculated by the following formula:

$$Force = K \times \Delta Y \times N,$$

where K is the spring stiffness of the mini-springs, $\Delta Y$ is the vertical displacement, and N is the numbers of die pads.

In another embodiment, the z-axis conductor is made up of MT type interconnector material, which contains a plurality of fine parallel wires embedded in a silicone rubber wafer. Each of the fine wires protrudes from both sides of the silicon wafer. When a target die is placed over the MT type interconnector, the fine wires provide electrical connections between the upper contacts of the tape and the bond pads of the target die.

BRIEF DESCRIPTION OF THE DRAWINGS

These and other features, aspects, and advantages of the present invention will become better understood with the following description, appended claims, and accompanying drawings where:

DETAILED DESCRIPTION OF EMBODIMENTS OF THE INVENTION

In the following description, the term "z-axis conductor" designates materials which include conductors incorporated into a non-conductive or semiconductive base material (substrate), wherein the conductors are arranged to produce generally parallel conductive paths through the base material. Examples of z-axis conductors are provided in the following description. These examples are not intended to limit the appended claims.

Figure 1:
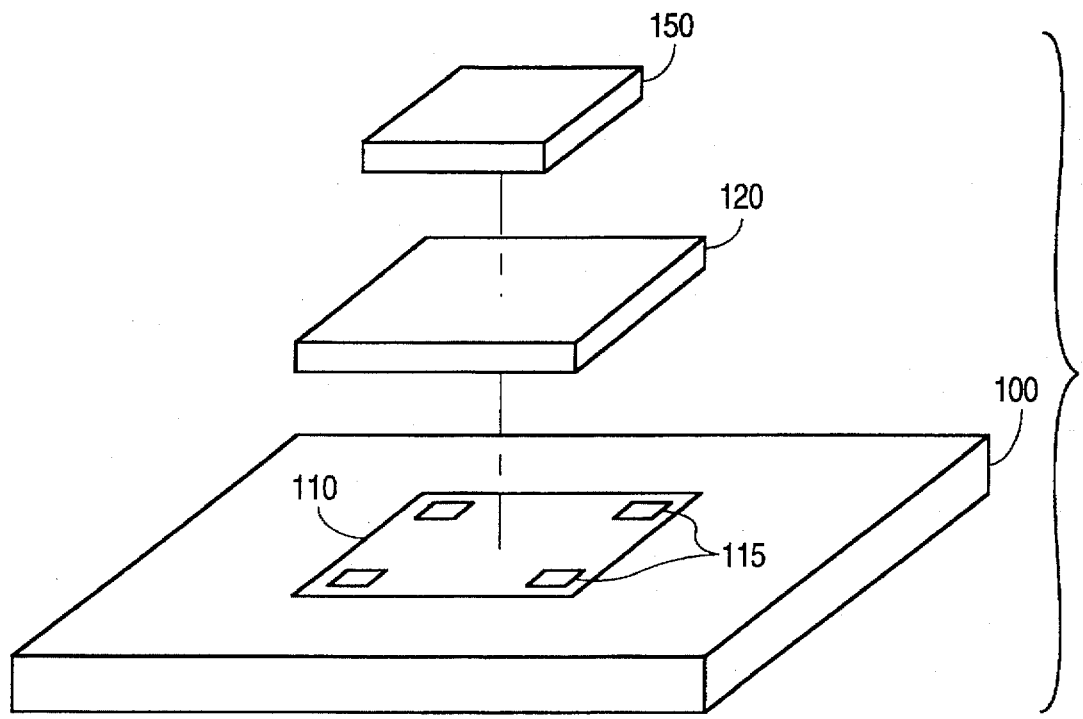
FIG. 1 is a perspective exploded view showing a test apparatus in accordance with a first aspect of the present invention.

FIG. 1 shows a test apparatus for testing target die 150 in accordance with a first embodiment of the present invention. Target die 150 is preferably a flip chip die which includes a matrix of bonding pads (not shown) arranged on a lower surface. In accordance with the present invention, it is not necessary for the bonding pads to be solder bumped prior to testing. Alternatively, target die 150 may include bonding pads arranged around a perimeter of the lower surface.

3

The test apparatus includes a non-conductive support plate 100 supporting a polyimide tape 110 which includes a plurality of contacts 115 arranged in a pattern matching the arrangement of bonding pads (not shown) on the lower surface of target die 150. Conductive traces (not shown) are also formed on tape 110 which in turn lead to test sockets of the test equipment (not shown). Positioned above tape 110 is a z-axis conductor 120, which is conductive in the z-axis direction (as indicated) while being non-conductive in the x-axis and y-axis directions.

In accordance with the first embodiment of the present invention, die 150 is tested by placing the z-axis conductor 120 onto tape 110 and placing die 150 on an upper surface of z-axis conductor 120 such that z-axis conductor 120 provides conductive paths between contacts 115 and associated bonding pads of die 150. Test signals are then transmitted on the conductive traces of tape 110 to the bonding pads of die 150 through z-axis conductor 120.

Figure 2:
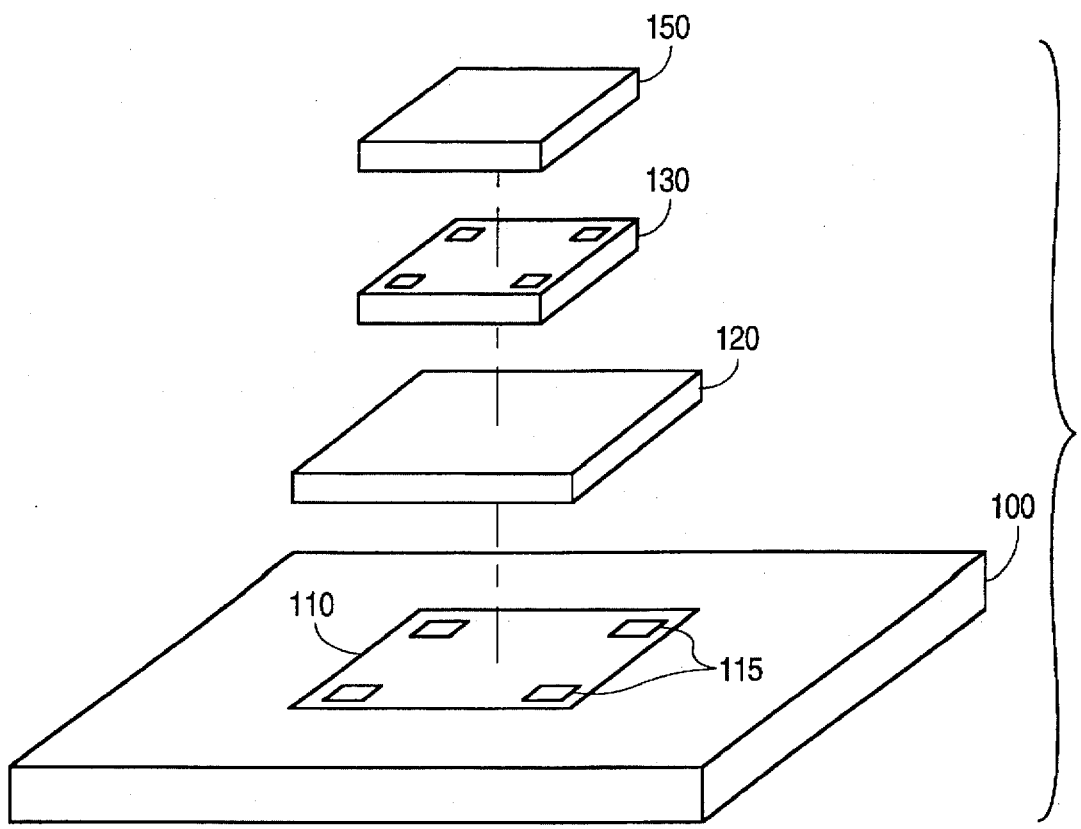
FIG. 2 is a perspective exploded view showing a test apparatus in accordance with a second embodiment of the present invention.

FIG. 2 shows a test apparatus in accordance with a second embodiment of the present invention. In accordance with the second embodiment, a non-conductive plate 130 is positioned between z-axis conductor 120 and die 150. Non-conductive plate 130 defines a plurality of holes 132 which match the arrangement of bonding pads on a lower surface of die 150. Testing of die 150 is performed in essentially the same manner as that described with the first embodiment above. Non-conductive plate 130 provides protection for a lower surface of die 150 while allowing contact between z-axis conductor 120 and the bonding pads of die 150.

Figure 3:
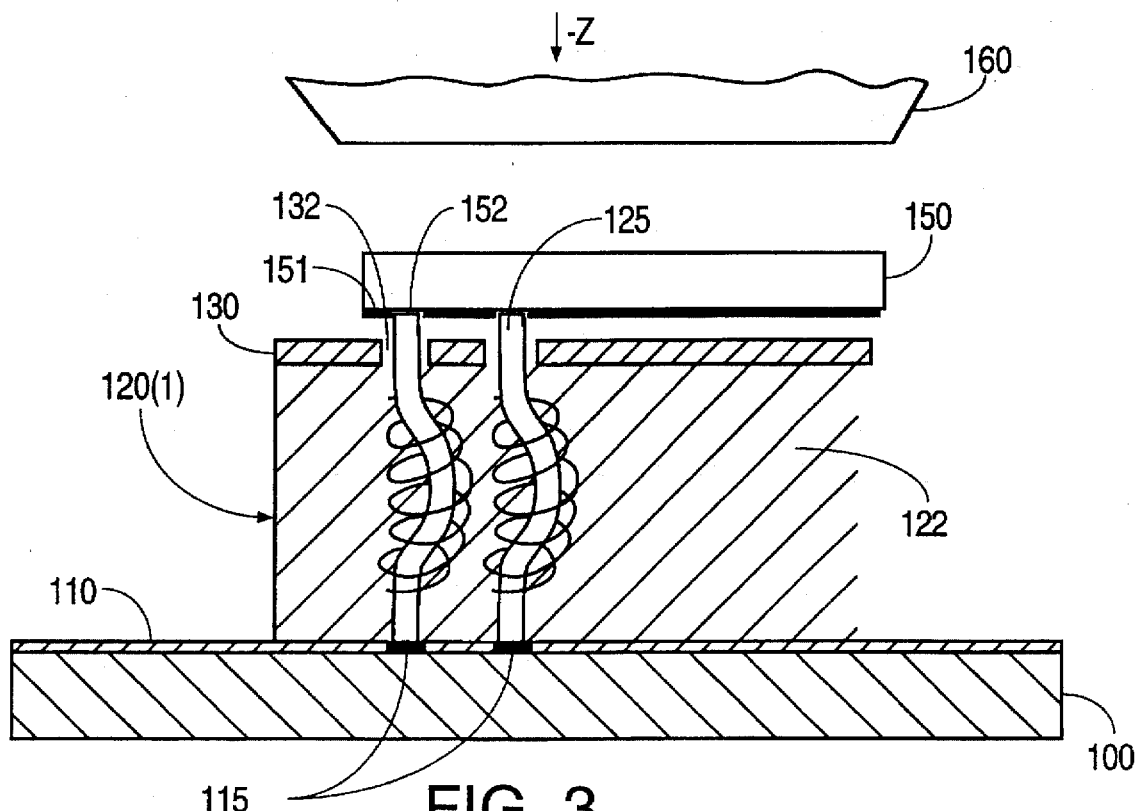
FIG. 3 is a section view of the present invention showing a first z-axis conductor.

FIG. 3 shows a third embodiment of the present invention wherein a z-axis conductor 120(1) includes a non-conductive, sponge-like material into which is formed a plurality of conductive mini-springs 125. The lower ends of some of the mini-springs 125 are electrically connected to contacts 115 of tape 110. In accordance with the third aspect of the present invention, a cold plate 160 (for example, anodized aluminum) presses an upper surface of die 150 in the −z direction, thereby pressing die 150 toward base 100. As die 150 is pressed downward, the non-conductive elastic material 122 of z-axis conductor 120(1) is compressed in the z direction such that upper ends of mini-springs 125 protrude through non-conductive plate 130 to contact bonding pads 152 of die 150. A contact force applied to cold plate 160 may be calculated using the following formula:

$$Force = K \times \Delta Y \times N,$$

where K is a spring stiffness of mini-springs 125, AY is the vertical displacement of non-conductive plate 130, and N is the number of bonding pads 152.

Figure 4:
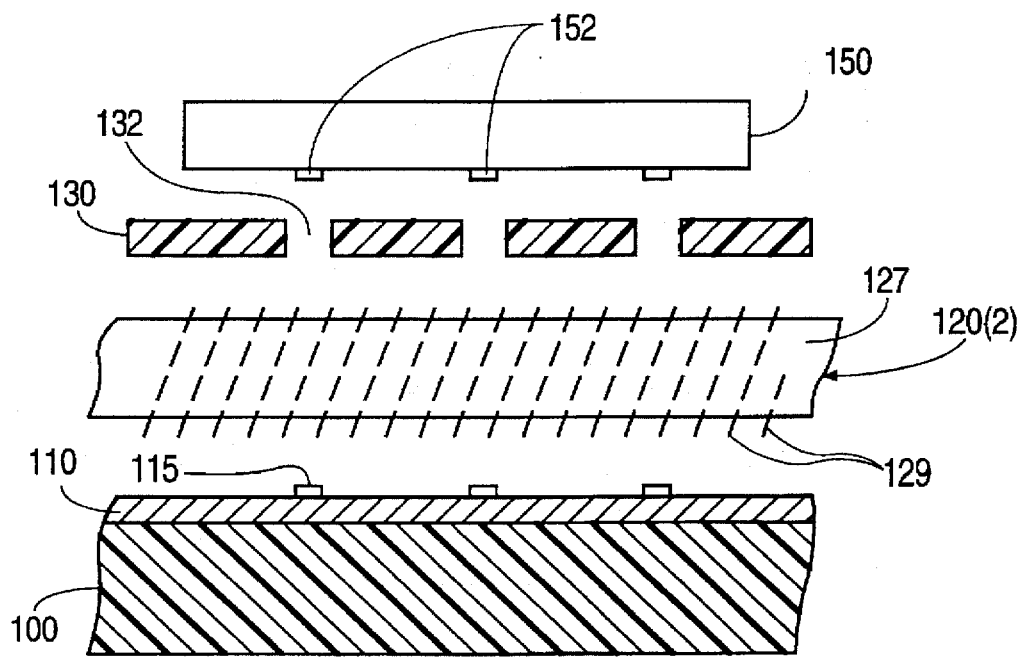
FIG. 4 is a section view of the present invention showing another z-axis conductor.

FIG. 4 shows a fourth embodiment of the present invention in which z-axis conductor 120(2) is a piece of MT type interconnector (produced by Shin-Etsu Polymer Co., Ltd. of Saitama, Japan). MT type interconnector includes a fine pitch matrix of gold plated wires 129 which are arranged at 45° angles and supported in a silicone rubber wafer 127. Each wire 129 includes ends protruding from upper and lower surfaces of silicone rubber wafer 127. In accordance with the fourth embodiment, z-axis conductor 120(2) is placed on the upper surface of tape 110 which includes a pattern of conducts 115, and die 150 is placed over the upper surface of silicone rubber wafer 127. Alternatively, a non-conductive plate 130 having openings 132 can optionally be placed between die 150 and silicone rubber wafer 127. Wires 129 provide conductive paths between bonding pads 152 of die 150 and contacts 115 of tape 110. Because of the 45° angle of the wires 129, die 150 must be slightly offset from the pattern of conducts 115 on tape 110. Test signals are then transmitted by test circuitry (not shown) through substrate 120(2) between die 150 and tape 110.

In the above applications, non-conductive plate 130 may be omitted if solder bumps are formed over bonding pads 152 prior to the testing procedure. In addition, a protective coating or passivation may be formed over a lower surface of die 150 in place of non-conductive plate 130. Finally, plate 130 may be made from aluminum oxide or glass, and may be formed directly on an upper surface of non-conductive plate 120.

While particular embodiments of the present invention have been shown and described, it will be obvious to those skilled in the art that changes and modifications may be made without departing from this invention in its broader aspects. For example, additional z-axis conductors may be used other than those specifically listed in the present invention. One such additional z-axis conductor may include an elastomeric silicon material containing metal particles which produce z-axis conduction when pressed in a z-axis direction. Therefore, the appended claims are to encompass within their scope all such changes and modifications as fall within the true spirit and scope of this invention.

What is claimed is:

1. An apparatus for testing an integrated circuit chip prior to mounting on a package, the integrated circuit chip including a plurality of bonding pads arranged in a predetermined pattern, the apparatus comprising:

a plurality of contacts arranged in the predetermined pattern;

a substrate positioned over the plurality of first conductors, the substrate having opposing first and second surfaces and including plurality of conductors extending between the first surface and the second surface, the first surface being mounted on the plurality of contacts; and a non-conductive plate having a plurality of openings arranged in the predetermined pattern, the non-conductive plate being mounted on the second surface of the substrate;

wherein when the integrated circuit chip is pressed against the non-conductive plate, at least one of the conductors protrudes through each opening and contacts one of the bonding pads, thereby providing an electrical connection between each of the plurality of contacts and an associated one of the bonding pads.

2. The apparatus of claim 1, wherein the non-conductive plate is ceramic.

3. The apparatus of claim 1, wherein the non-conductive plate is glass.

4. The apparatus of claim 1, wherein the substrate comprises:

a resilient non-conductive material including the first and second surfaces; and a plurality of conductive mini-springs, each of the plurality of mini-springs extending between the first and second surfaces of the non-conductive material.

5. The apparatus of claim 4, further comprising means for pressing the integrated circuit against the non-conductive plate to partially collapse the resilient non-conductive material, thereby causing at least one of the plurality of mini-springs to extend through one of the openings and to create an electrical connection between one of the plurality of contacts and one of the plurality of bonding pads.

6. The apparatus of claim 1, wherein the substrate comprises a silicone rubber wafer defining the first and second surfaces, the silicone rubber wafer including a plurality of parallel metal wires extending between the first and second surfaces.

7. A method for testing an integrated circuit chip prior to mounting on a package, the integrated circuit chip including a plurality of bonding pads arranged in a predetermined pattern, the method comprising:

provided a plurality of contacts arranged in the predetermined pattern;

positioning a substrate over the plurality of first conductors, the substrate having opposing first and second surfaces and including plurality of conductors extending between the first surface and the second surface, the first surface being mounted on the plurality of contacts;

positioning a non-conductive plate having a plurality of openings arranged in the predetermined pattern over the second surface of the substrate;

pressing the integrated circuit chip against the non-conductive plate such that at least one of the conductors protrudes through each opening and contacts one of the bonding pads, thereby providing an electrical connection between each of the plurality of contacts and an associated one of the bonding pads; and applying test signals to the plurality of contacts.

8. The method of claim 7, wherein the non-conductive plate is ceramic.

9. The method of claim 7, wherein the nonconductive plate is glass.

10. The method of claim 7, wherein the substrate comprises:

a resilient non-conductive material including the first and second surfaces; and a plurality of mini-springs, each of the plurality of mini-springs extending between the first and second surfaces of the non-conductive material;

and the method further comprises the step of:

pressing the integrated circuit chip against the non-conductive plate with a force sufficient to collapse the resilient non-conductive material such that connection is made between the bonding pads and the conductors through the mini-springs.

11. The method of claim 10, wherein the step of pressing comprises using a force determined by the formula:

$$Force = K \times \Delta Y \times N,$$

where K is a constant spring stiffness of the mini-springs, springs, $\Delta Y$ is a displacement of non-conductive plate, and N is a number of bonding pads of the integrated circuit chip.

12. The method of claim 10, wherein the step of pressing the integrated circuit against the non-conductive plate partially collapses the resilient non-conductive material, thereby causing at least one of the plurality of mini-springs to extend through one of the openings and to create an electrical connection between one of the plurality of contacts and one of the plurality of bonding pads.

13. The method of claim 7, wherein the substrate comprises a silicone rubber wafer defining the first and second surfaces, the silicone rubber wafer including a plurality of parallel metal wires extending between the first and second surfaces.

* * * * *

UNITED STATES PATENT AND TRADEMARK OFFICE
CERTIFICATE OF CORRECTION

PATENT NO.   : 5,686,842
DATED        : November 11, 1997
INVENTOR(S)  : Lee, Shaw Wei It is certified that error appears in the above-identified patent and that said Letters Patent is hereby corrected as shown below:

On the title page, item [73]:
    Please insert the Assignee as National Semiconductor, Inc.

Signed and Sealed this

Sixteenth Day of June, 1998

*Attest:*

BRUCE LEHMAN

*Attesting Officer*     *Commissioner of Patents and Trademarks*